United States Patent
Rampley et al.

(10) Patent No.: US 11,387,373 B2
(45) Date of Patent: *Jul. 12, 2022

(54) LOW DRAIN-SOURCE ON RESISTANCE SEMICONDUCTOR COMPONENT AND METHOD OF FABRICATION

(71) Applicant: NXP USA, Inc., Austin, TX (US)

(72) Inventors: Colby Greg Rampley, Phoenix, AZ (US); Jeffrey Lynn Weibrecht, Gilbert, AZ (US); Jeremy Kenneth Kramer, Gilbert, AZ (US); Elijah Blue Foster, Chandler, AZ (US); Melissa Picard, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 16 days.

This patent is subject to a terminal disclaimer.

(21) Appl. No.: 16/524,708

(22) Filed: Jul. 29, 2019

(65) Prior Publication Data

US 2021/0036169 A1 Feb. 4, 2021

(51) Int. Cl.
*H01L 31/0224* (2006.01)
*H01L 33/40* (2010.01)
*H01L 33/00* (2010.01)

(52) U.S. Cl.
CPC .. *H01L 31/022408* (2013.01); *H01L 33/0095* (2013.01); *H01L 33/40* (2013.01); *H01L 2224/83805* (2013.01)

(58) Field of Classification Search
CPC . H01L 2224/08502; H01L 2224/08506; H01L 2224/16502; H01L 2224/16506; H01L 2224/32502; H01L 2224/32506; H01L 2224/40506; H01L 2224/48506; H01L 2224/80805; H01L 2224/81805; H01L 2224/82805; H01L 2224/83805; H01L 2224/83894; H01L 2224/84805; H01L 2224/85805; H01L 2224/86805;

(Continued)

(56) References Cited

U.S. PATENT DOCUMENTS 2,854,366 A * 9/1958 Waters ................ H01L 21/3046
438/498
3,051,826 A * 8/1962 Avila ...................... H01L 24/26
219/128

(Continued)

OTHER PUBLICATIONS

Lin et al., "Formation of Silicon-Gold Eutectic Bond Using Localized Heating Method", Jpn. J. Appl. Phys. vol. 37, pp. L1412-L1414, University of Michigan (Year: 1998).*

(Continued)

*Primary Examiner* — Maliheh Malek (57) ABSTRACT

A device wafer is provided that includes a substrate having major and minor surfaces, and a plurality of active devices located at the major surface. A eutectic alloy composition having a first thickness is formed at the minor surface of the substrate. The eutectic alloy composition is partially removed from the minor surface of the substrate such that a second thickness of the eutectic alloy composition remains on the minor surface, the second thickness being less than the first thickness. A bonding layer is deposited over the eutectic alloy composition. The bonding layer is utilized for joining semiconductor components of the device wafer to secondary structures.

25 Claims, 5 Drawing Sheets

(58) Field of Classification Search
CPC ..... H01L 23/49582; H01L 2924/01079; H01L 2924/01322–01324
See application file for complete search history.

(56) References Cited

U.S. PATENT DOCUMENTS

| | | | | |
|---|---|---|---|---|
| 3,785,892 A * | 1/1974 | Terry | ................. | H01L 21/6836 438/113 |
| 3,846,159 A * | 11/1974 | Bornstein et al. | ...... | C23C 10/58 428/610 |
| 4,023,053 A * | 5/1977 | Shimizu | ............. | H01L 23/3107 327/586 |
| 4,123,293 A * | 10/1978 | Okikawa | ............ | B23K 35/3013 148/432 |
| 4,534,820 A * | 8/1985 | Mori | ....................... | C30B 11/12 117/58 |
| 4,702,941 A * | 10/1987 | Mitchell | .............. | B23K 20/233 204/192.15 |
| 5,851,845 A * | 12/1998 | Wood | .................. | H01L 21/6836 438/15 |
| 5,923,956 A * | 7/1999 | Kondou | .................. | H01J 9/022 438/118 |
| 6,803,243 B2 | 10/2004 | Slater, Jr. et al. | | |
| 6,884,644 B1 | 4/2005 | Slater, Jr. et al. | | |
| 6,893,947 B2 * | 5/2005 | Martinez | ........... | H01L 21/28587 257/E21.449 |
| 6,909,119 B2 | 6/2005 | Slater, Jr. et al. | | |
| 7,402,899 B1 * | 7/2008 | Whiting | ................ | B81B 7/0077 257/678 |
| 7,659,191 B2 * | 2/2010 | Liu | ......................... | H01L 24/33 438/611 |
| 9,111,983 B1 * | 8/2015 | Ginter | .................... | B32B 43/006 |
| 9,941,210 B1 * | 4/2018 | Viswanathan | .... | H01L 21/76898 |
| 10,014,262 B2 * | 7/2018 | Klingbeil | ............ | H01L 21/6836 |
| 10,340,251 B2 * | 7/2019 | Magnus | .............. | H01L 23/5383 |
| 10,741,446 B2 * | 8/2020 | Molla | .................. | H01L 21/6835 |
| 10,825,747 B2 * | 11/2020 | Li | ....................... | H01L 23/047 |
| 10,998,231 B2 * | 5/2021 | Rampley | ................ | H01L 23/585 |
| 2005/0042838 A1 * | 2/2005 | Garyainov | .............. | H01L 24/10 438/455 |
| 2006/0249847 A1 * | 11/2006 | Eriksen | ................. | C23C 14/021 257/751 |
| 2007/0231954 A1 * | 10/2007 | Liu | ......................... | H01L 24/27 438/106 |
| 2008/0124838 A1 * | 5/2008 | Liu | ......................... | H01L 24/33 438/113 |
| 2009/0317654 A1 * | 12/2009 | Saruwatari | ............. | C22C 21/10 428/600 |
| 2010/0072555 A1 * | 3/2010 | Meng | ...................... | H01L 25/50 438/455 |
| 2012/0134115 A1 * | 5/2012 | Schulz-Harder | .... | H01L 23/3735 361/720 |
| 2012/0286429 A1 * | 11/2012 | Han | ........................ | H01L 24/94 257/774 |
| 2014/0091454 A1 * | 4/2014 | Lin | ..................... | H01L 23/3121 257/734 |
| 2015/0001708 A1 * | 1/2015 | Lin | ..................... | H01L 23/5389 257/737 |
| 2015/0353342 A1 * | 12/2015 | Chang | ................. | B81C 1/00484 438/51 |
| 2018/0012855 A1 * | 1/2018 | Abdo | ...................... | H01L 24/29 |
| 2018/0059290 A1 * | 3/2018 | Weibrecht | ................ | G02B 1/14 |
| 2018/0229321 A1 * | 8/2018 | Zhai | ........................ | G01M 1/32 |
| 2019/0013242 A1 * | 1/2019 | Molla | .................... | H01L 21/304 |
| 2019/0088852 A1 * | 3/2019 | Mizusawa | ............ | H01L 41/0475 |
| 2020/0234992 A1 * | 7/2020 | Hoescheler | ......... | H01L 21/6833 |
| 2020/0331064 A1 * | 10/2020 | Sherman | ................ | B32B 18/00 |
| 2020/0335398 A1 * | 10/2020 | Molla | ................. | H01L 21/3065 |
| 2020/0358423 A1 * | 11/2020 | Pao | ....................... | H03H 9/0523 |
| 2020/0395247 A1 * | 12/2020 | Rampley | ............. | H01L 21/6836 |
| 2021/0036169 A1 * | 2/2021 | Rampley | ................. | H01L 33/40 |

OTHER PUBLICATIONS

"Gold Deplate", Class One Technology, site: https://classone.com/high-performance-plating-surface-preparation/gold-deplate/#:~:text=Electrolytic%20deplate%20is%20fundamentally%20an%20electropolish%20process,and%2C%20as%20such%2C%20operates%20on%20the%20line-of-sight%20principle.(Year: 2021).*

Chang, J.F. et al; "Silicide formation of Au thin films on (1 0 0) Si during annealing"; Elsevier, Science Direct, Materials Chemistry and Physics 83; pp. 199-203 (2004).

Chen, L.J; "Metal Silicides: An Integral Part of Microelectronics"; TMS, vol. 57, No. 9; retrieved from the internet www.tms.org/pubs/journals/jom/0509/chen-0509.html on Jul. 23, 2019; 9 pages (2005).

Mangelinck, D. et al; "Formation of Ni silicide from Ni(Au) films on (111)Si"; Journal of Applied Physics, 79, 408; 10 pages (1996).

Naem, A.A.; "Platinum silicide formation using rapid thermal processing"; Journal of Applied Physics, 64, 4161; 8 pages (1988).

O Bisi et al; "Electronic properties of metal-rich Au—Si compounds and interfaces"; Journal of Physics C: Solid State Physics, 15, 4707; 11 pages (1982).

* cited by examiner

FIG. 1

PRIOR ART

LOW DRAIN-SOURCE ON RESISTANCE SEMICONDUCTOR COMPONENT AND METHOD OF FABRICATION

TECHNICAL FIELD OF THE INVENTION

The present invention relates generally to semiconductor processing. More specifically, the present invention relates to semiconductor components and methods for fabricating low drain-source on resistance ($R_{DSON}$) semiconductor components.

BACKGROUND OF THE INVENTION

In the fabrication of semiconductor components, a large number of semiconductor components is typically fabricated on a single silicon wafer. Device function may be implemented in the silicon wafer through process steps of diffusion, oxidation, and the like. Subsequent process operations may entail wafer thinning at the back side (e.g., the non-device side) of the wafer and separating the wafer into a plurality of individual components. Each of the components can be mounted in a package for protection, heat sinking, electrical connection, and so forth.

SUMMARY

Aspects of the disclosure are defined in the accompanying claims.

In a first aspect, there is provided method comprising providing a device wafer, the device wafer including a substrate having a major surface and a minor surface opposite the major surface, and a plurality of active devices located at the major surface, forming a eutectic alloy composition at the minor surface of the substrate, the eutectic alloy composition having a first thickness, partially removing the eutectic alloy composition from the minor surface of the substrate such that a second thickness of the eutectic alloy composition remains on the minor surface, the second thickness being less than the first thickness, and depositing a bonding layer over the eutectic alloy composition.

In a second aspect, there is provided a method of attaching a semiconductor component to a secondary structure comprising providing a device wafer, the device wafer including a substrate having a major surface and a minor surface opposite the major surface, a plurality of semiconductor die areas at the major surface, a plurality of active devices located at the plurality of semiconductor die areas, and streets around peripheries of the semiconductor die areas, forming a eutectic alloy composition at the minor surface of the substrate, the eutectic alloy composition having a first thickness, partially removing the eutectic alloy composition from the minor surface of the substrate such that a second thickness of the eutectic alloy composition remains on the minor surface, the second thickness being less than the first thickness, depositing a bonding layer over the eutectic alloy composition, separating the plurality of the semiconductor die areas at the streets to produce a plurality of semiconductor components each having the bonding layer, the semiconductor component being one of the plurality of semiconductor components, and utilizing the bonding layer to attach the semiconductor component to the secondary structure.

In a third aspect, there is provided a semiconductor component comprising a substrate portion having a major surface and a minor surface opposite the major surface, at least one active device located at the major surface of the substrate portion, a eutectic alloy composition formed at the minor surface of the substrate, and a bonding layer over the eutectic alloy composition.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a semiconductor device wafer, semiconductor components, and methodology for manufacturing a device wafer and for attaching semiconductor components of the device wafer to secondary structures. More particularly, methodology entails forming a eutectic alloy composition across the entirety of the back surface of a device wafer and thereafter thinning the eutectic alloy composition. The methodology further entails depositing a bonding layer over the thinned eutectic alloy composition. Eutectic alloy composition formation and deposition of the bonding layer over the thinned eutectic alloy composition may be integrated into a process flow to produce semiconductor components having a low drain-source on resistance ($R_{DSON}$) interface with good barrier properties for interconnection to secondary structures.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming fabrication techniques of depositing, patterning, etching, and so forth.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures, bulk or semiconductor-on-insulator (SOI) structures. For convenience of explanation and not intended to be limiting, semiconductor devices and methods of fabrication are described herein for silicon semiconductors, but persons of skill in the art will understand that other semiconductor materials may also be used.

Figure 1:
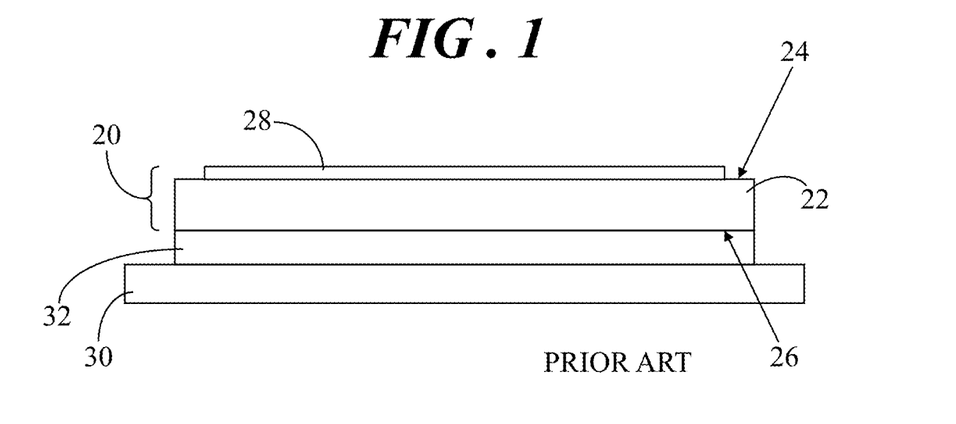
FIG. 1 shows a side view of a portion of a prior art device wafer.

Referring to FIG. 1, FIG. 1 shows a side view of a portion of a prior art semiconductor component 20. Semiconductor component 20 includes a silicon substrate 22 having a major surface 24 and a minor surface 26 opposite major surface 24. The term "major surface" refers to the side of substrate 22 at which active devices 28 of semiconductor component 20 are located. The term "minor surface" refers to the back side, or inactive side, of substrate 22. Semiconductor component 20 is bonded to a secondary structure 30 via a bonding layer 32. Active devices 28 that make up semiconductor component 20 may be any of a myriad of different types of circuit devices used in electronics such as, for example, transistors, microprocessors, graphics processors, application specific integrated circuits, memory devices, and the like. Secondary structure 30 may be metal or a metallized structure, such as a leadframe, heat sink, printed circuit board, and the like. Bonding layer 32 may be solder, an adhesive epoxy, or another suitable material for attaching semiconductor component 20 to secondary structure 30.

In one technique, semiconductor component 20 may be attached using a silver sinter die attach process. In this technique, a eutectic gold backmetal is used as bonding layer 32. That is, minor surface 26 of silicon substrate 22 is coated with gold bonding layer 32 and the silver sinter forms a bond between the gold coated silicon substrate 22 and secondary structure 30. The implementation of a silver sinter bonding process with a gold coated silicon substrate can be problematic. For example, if the silicon of substrate 22 diffuses completely through the gold layer so that silicon atoms are exposed at the surface of the gold bonding layer 32, these silicon atoms can subsequently be oxidized, whether by heating during a subsequent assembly step or just by exposure to room ambient conditions. The formation of oxidized silicon at the gold surface can act as a barrier to the complete wetting of the surface during attachment to secondary structure 30. This results in the formation of voids in the die bond which can cause delamination at the silver sinter/bonding layer interface, thereby severely impacting the reliability of the die bond.

In another technique, semiconductor component 20 is attached to secondary structure 30 using a solderable backmetal as bonding layer 32. A solderable backmetal may entail multiple material layers such as, for example, titanium/nickel-vanadium/silver/gold (Ti/NiV/Ag/Au), titanium-tungsten/nickel-vanadium/titanium-tungsten/gold (TiW/NiV/TiW/Au), gold/titanium-tungsten/gold (Au/TiW/Au), and the like. Such solderable die attach techniques and materials may yield stronger die bonds to secondary structure 30 than the gold/silicon eutectic bonding method because the silicon of substrate 22 cannot diffuse through the solderable backmetal bonding layer 32. However, solderable die attach techniques yield an increased contact resistance between semiconductor component 20 and secondary structure 30 (e.g., lead frame). The term "contact resistance" refers to the contribution of the total resistance of a system, which can be attributed to the contacting interface of electrical leads and connections to secondary structures as opposed to the intrinsic resistance of the system.

The "drain-source on resistance," abbreviated $R_{DSON}$, is the total resistance in the path between the drain and source in a Metal Oxide Field Effect Transistor (MOSFET) when the MOSFET is in the on-state. In general, current flows between the channels of a MOSFET when a gate-to-source voltage ($V_{GS}$) is applied. Otherwise the MOSFET behaves like a resistor. When $V_{GS}$ reaches the threshold voltage $V_{GS(th)}$, an inversion layer forms that enables current flow. The inversion layer becomes the conductive path (or channel) of the MOSFET between drain and source. A MOSFET device provides superior power-switching performance when $R_{DSON}$ is minimized because the voltage drop from drain-to-source is also minimized for a given value of drain-source current. Accordingly, it is highly desirable to minimize $R_{DSON}$, and indeed, $R_{DSON}$ is typically the basis for a maximum current rating of a MOSFET.

$R_{DSON}$ is made up of a series of resistances that traverses the path of current flow. Besides the inherent structural contributors, $R_{DSON}$ additionally includes the sum of many components contributed by the bond wire resistance, contact resistance between the source and drain, metallization, the silicon, and any lead frame contributions. Accordingly, the contact resistance between semiconductor component 20 and secondary structure 30 resulting from the aforementioned solderable die attach techniques contributes to, and can adversely affect, the drain-source on resistance, $R_{DSON}$. Embodiments described herein include process operations that can yield semiconductor components having a low $R_{DSON}$ interface with good barrier properties for interconnection to secondary structures.

Figure 2:
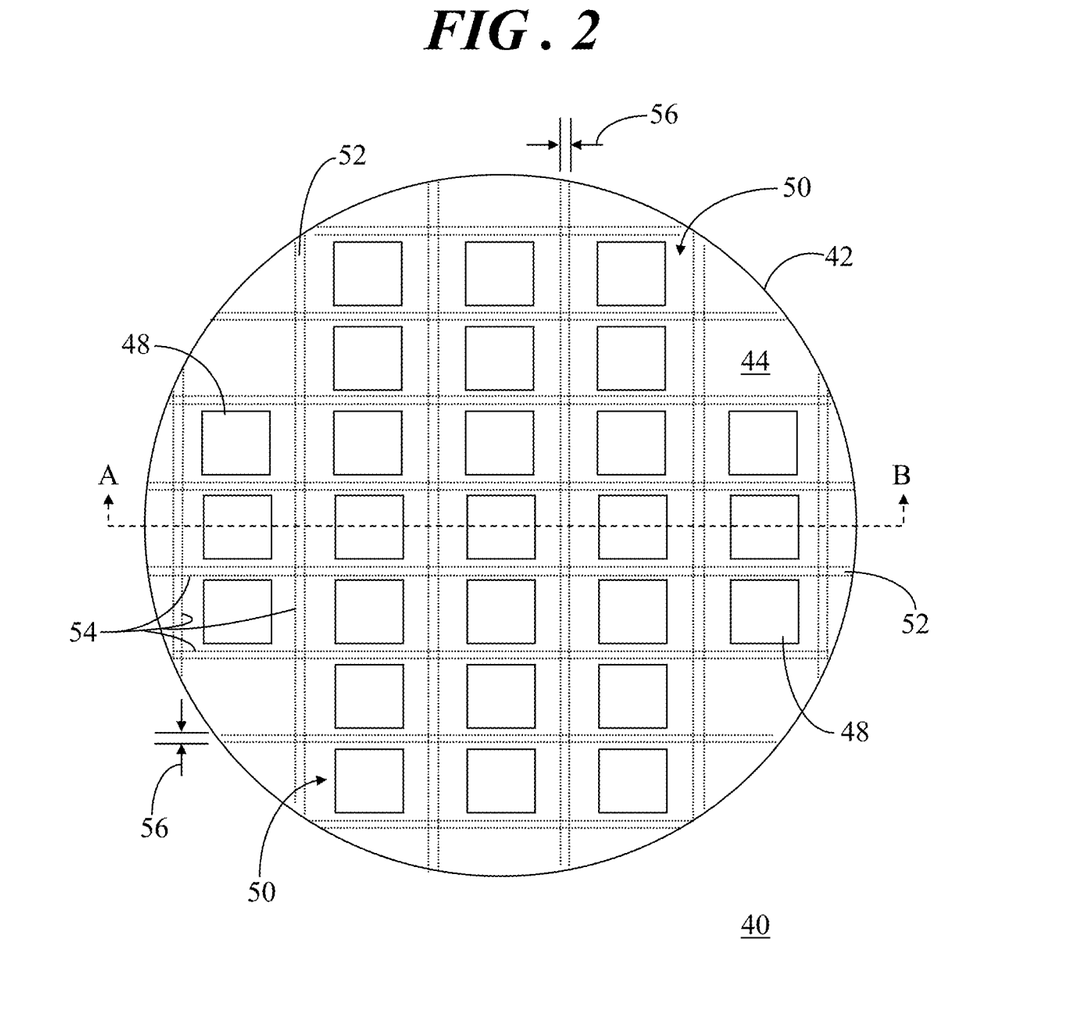
FIG. 2 shows a plan view of a device wafer.
Figure 3:
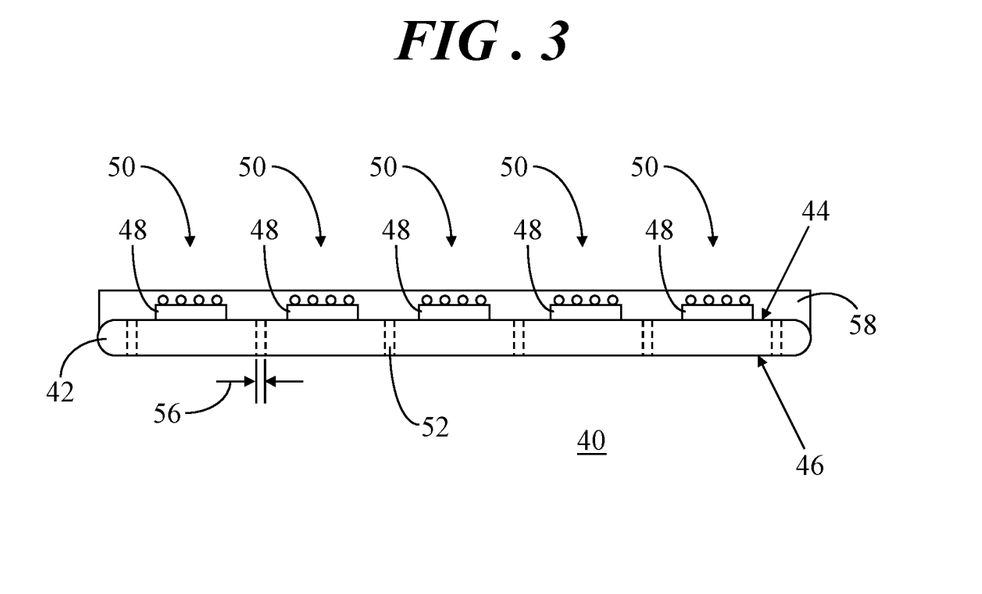
FIG. 3 shows a cross-sectional view of the device wafer along section lines A-B in FIG. 2.

Referring to FIGS. 2-3, FIG. 2 shows a plan view of a device wafer 40 and FIG. 3 shows a cross-sectional view of device wafer 40 along section lines A-B in FIG. 2. A device wafer 40 is provided that includes a substrate 42 having a major surface 44 and a minor surface 46 opposite major surface 44. Again, the term "major surface" refers to the side of substrate 42 at which active devices 48 are located and the term "minor surface" refers to the back side, or inactive side, of substrate 42. Substrate 42 may be a silicon substrate and active devices 48, generally represented by boxes, may be any of a myriad of different types of circuit devices used in electronics such as, for example, transistors, microprocessors, graphics processors, application specific integrated circuits, memory devices, and the like. In alternate embodiments, substrate 42 can include any semiconductor material or combinations of materials, such as gallium arsenide, silicon germanium, silicon, monocrystalline silicon, the like, and combinations of the above.

Device wafer 40 includes a plurality of semiconductor die areas 50 at which active devices 48 are located. Streets 52 are located between semiconductor die areas 50 around peripheries 54 of each of semiconductor die areas. Streets 52 (also referred to as saw streets, kerf, dicing lines) represent the areas between adjacent semiconductor die areas 50. In this example illustration, each of streets 52 is represented by a pair of dashed lines thereby indicating that streets 52 are characterized by a width 56. Width 56 represents an amount of material loss (e.g., width of a saw cut) that may occur when device wafer 40 is diced, cut, or otherwise separated along streets 52. Accordingly, active devices 48 are not present in, or very near to, streets 52. Major surface 44 of device wafer 40, along with active devices 48, may be laminated or otherwise encapsulated in, for example, a UV-curable back-grinding tape 58, which ensures against damage to major surface 44 and/or active devices 48 during subsequent processes (discussed below) and prevents wafer surface contamination caused by infiltration of grinding fluid and/or debris.

Figure 4:
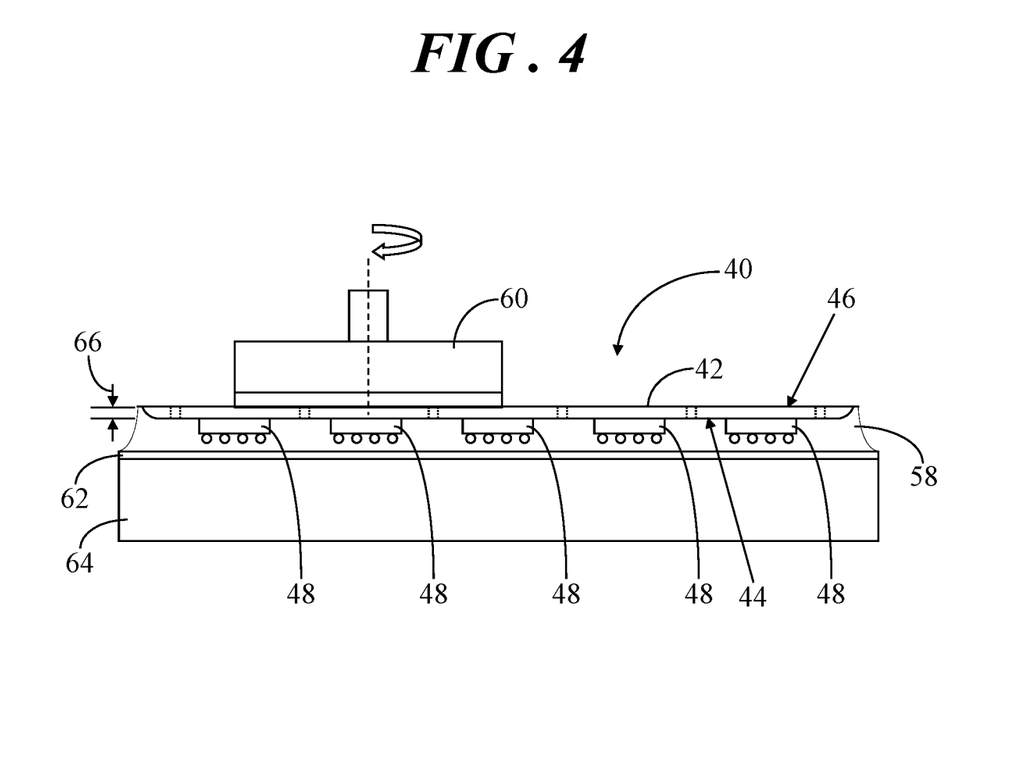
FIG. 4 shows a cross-sectional view of the device wafer of FIG. 3 at an intermediate stage of processing.

FIG. 4 shows a cross-sectional view of the device wafer 40 of FIG. 3 at an intermediate stage of processing. At this stage of processing, device wafer 40 may undergo wafer thinning at minor surface 46 of substrate 42. Wafer thinning, also referred as wafer backgrinding, is a semiconductor device fabrication process during which the substrate thickness is reduced using, for example, a rotating or oscillating backgrinding tool 60. For example, a temporary adhesive 62 may be used to attach device wafer 40 to a carrier structure 64 with minor surface 46 of substrate 42 facing backgrinding tool 60. Substrate 42 may be reduced to a thickness 66 that is 10% or less than the original thickness of substrate 42. Wafer thinning processes enable stacking and high-density packaging of integrated circuits.

Figure 5:
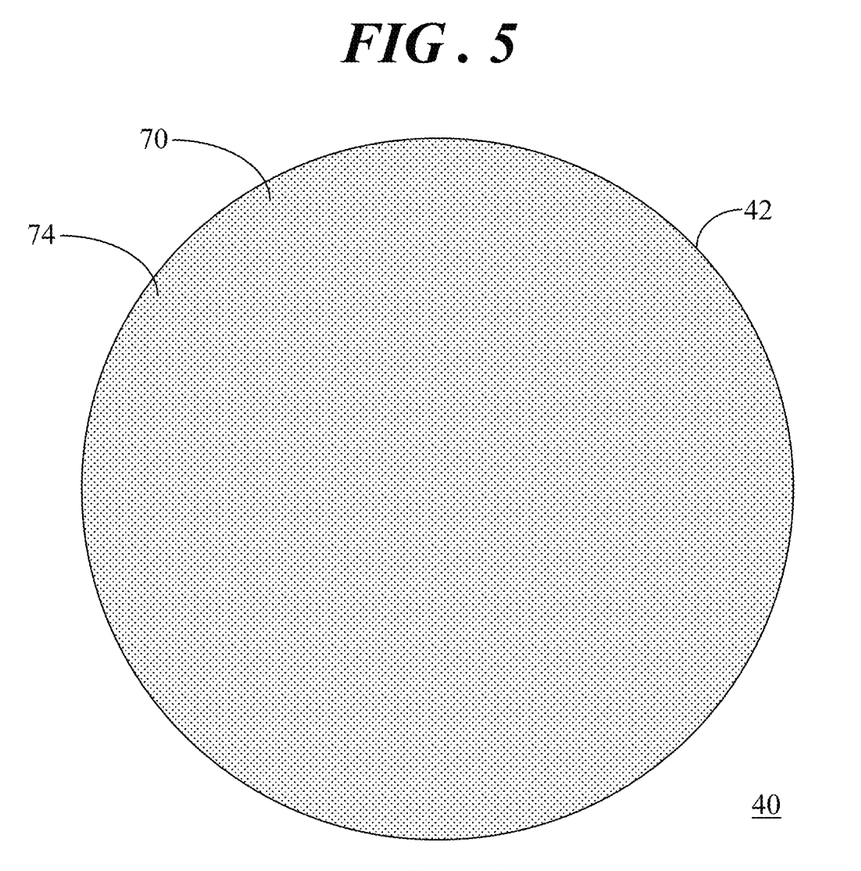
FIG. 5 shows a plan view of the device wafer of FIG. 4 at a subsequent stage of processing.
Figure 6:
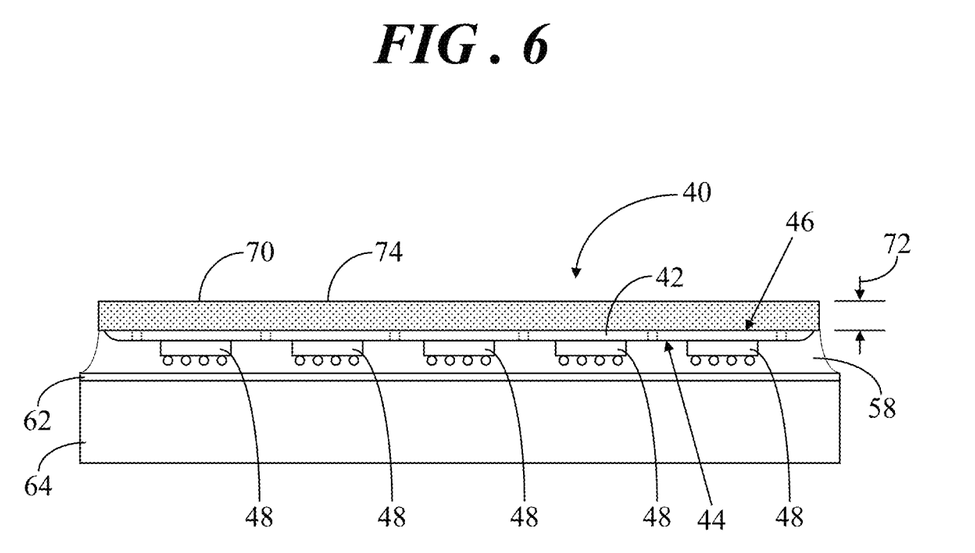
FIG. 6 shows a cross-sectional view of the device wafer of FIG. 5.

Referring to FIGS. 5-6, FIG. 5 shows a plan view of device wafer 40 of FIG. 4 at a subsequent stage of processing and FIG. 6 shows a cross-sectional view of device wafer 40. In accordance with an embodiment, methodology entails applying or depositing a eutectic forming material layer 70 on minor surface 46 of substrate 42. In FIGS. 5-6, as well as subsequent FIGS. 7-12, carrier structure 64, temporary adhesive 62, and back-grinding tape 58 are shown for simplicity. However, it should be understood that during semiconductor wafer processing operations, carrier structure 64, temporary adhesive 62, and back-grinding tape 58 may be replaced by other suitable handlers and adhesives.

In an example, eutectic forming material layer 70 may be pure gold or gold alloyed with small amounts (typically 1-2% or less) of other materials such as germanium, chromium, or the like. Eutectic forming material layer 70 may be deposited to a first thickness 72 in a range of 2.5-7.5 kilo Angstroms (kA). In some embodiments, first thickness 72 may be 5 kA. Device wafer 40 may then be heated to a temperature in a range of, for example, 330°-360° C. to alloy layer 70 with silicon substrate 42 to form a eutectic alloy composition 74. In this example in which substrate 42 is silicon and eutectic forming material layer 70 is gold, the resulting eutectic alloy composition 74 is a silicon-gold eutectic layer.

Figure 7:
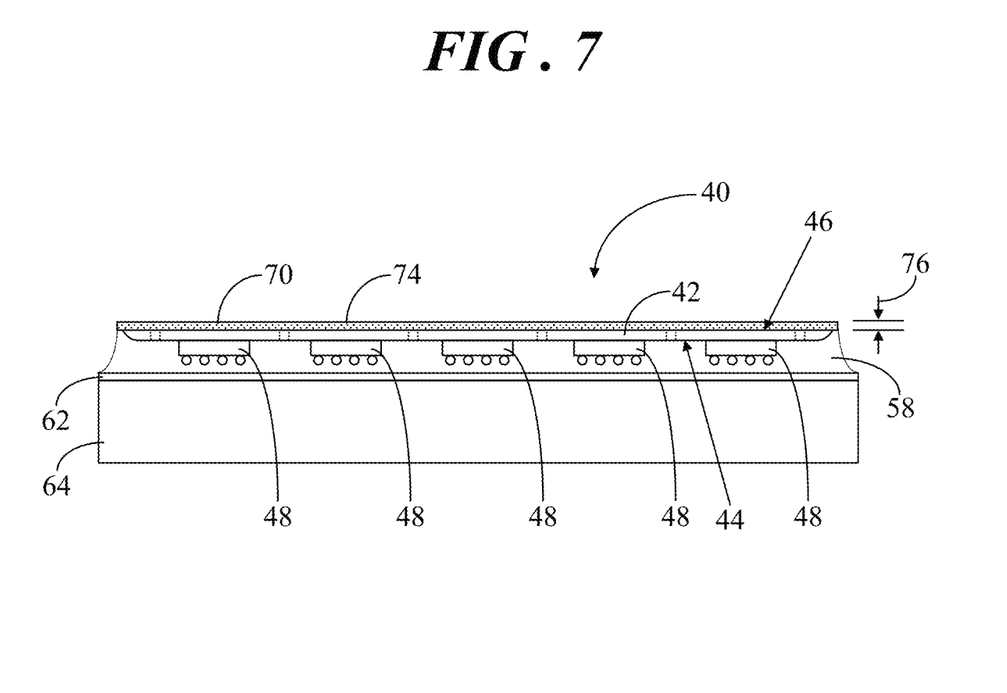
FIG. 7 shows a cross-sectional view of the device wafer of FIGS. 5-6 at a subsequent stage of processing.

FIG. 7 shows a cross-sectional view of the device wafer 40 of FIGS. 5-6 at a subsequent stage of processing. In accordance with some embodiments, methodology further entails partially removing eutectic alloy composition 74 from minor surface 46 of substrate 42 such that a second thickness 76 of eutectic alloy composition 74 remains on minor surface 46, in which second thickness 76 is less than first thickness 66 (FIG. 6). The bulk or majority of eutectic alloy composition 74 may be removed by, for example, a wet etch process or deplate process. Wet etching processes use liquid-phase ("wet") etchants to essentially dissolve the material (e.g., eutectic alloy composition 74). Deplating processes use an electric current to electrically bias a surface so as to remove a material (e.g., eutectic alloy composition 74) from the surface. Such processes may be effective for removing the bulk of eutectic alloy composition 74 without damaging the silicon substrate 42. Alternative embodiments may implement any suitable process that would remove the bulk of eutectic alloy composition 74 without damaging the silicon substrate 42.

In general, second thickness 76 of eutectic alloy composition 74 remains overlying an entirety of minor surface 46 of substrate 42 following the partial removal of eutectic alloy composition 74. However, second thickness 76 is significantly less than first thickness 72. As mentioned previously, when substrate 42 is silicon and eutectic forming material layer 70 is gold, the resulting eutectic alloy composition 74 is a silicon-gold eutectic layer. The remaining second thickness 76 of eutectic alloy composition 74 forms a patchwork of eutectic (e.g., a generally homogeneous mixture of silicon and gold). The silicon in eutectic alloy composition 74 is sufficient to securely bond with a subsequent bonding layer (discussed in connection with FIG. 8). The gold in eutectic alloy composition 74 yields low resistance electrically conductive pathways between substrate 42 and the subsequent bonding layer. Accordingly, the electrically conductive pathways can result in a low contact resistance, to ultimately improve (i.e., reduce) $R_{DSON}$.

In some embodiments, following removal of eutectic alloy composition 74 and prior to depositing a bonding layer (discussed in connection with FIG. 8), device wafer 40 may be thermally processed. By way of example, device wafer 40 may be subjected to a temperature sufficient to anneal the mixture of silicon and gold in eutectic alloy composition 74. In some embodiments, a temperature for thermally processing eutectic alloy composition 74 may be in a range of 300-400° C., and more specifically, approximately 380° C. The resulting annealed eutectic alloy composition 74 may further improve (i.e., reduce) the contact resistance, to ultimately further reduce $R_{DSON}$.

Figure 8:
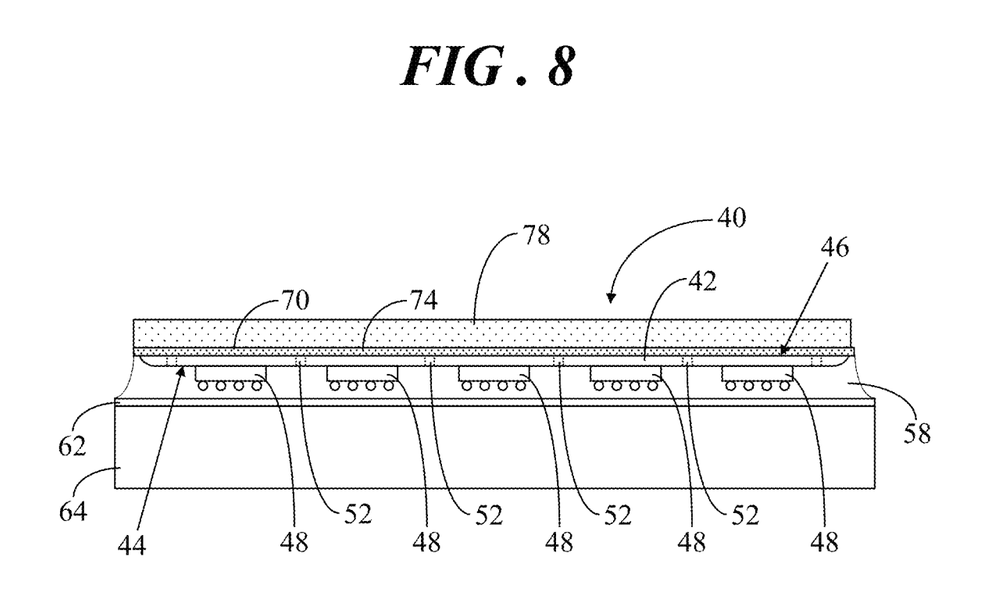
FIG. 8 shows a cross-sectional view of the device wafer of FIG. 7 at a subsequent stage of processing.

FIG. 8 shows a cross-sectional view of device wafer 40 of FIG. 7 at a subsequent stage of processing in which a bonding layer 78 is deposited over eutectic alloy composition 74. In some embodiments, bonding layer 78 may be a solderable backmetal such as any of the previously mentioned layered solderable backmetal materials. In alternative embodiments, bonding layer 78 may be an adhesive epoxy or another suitable material.

Figure 9:
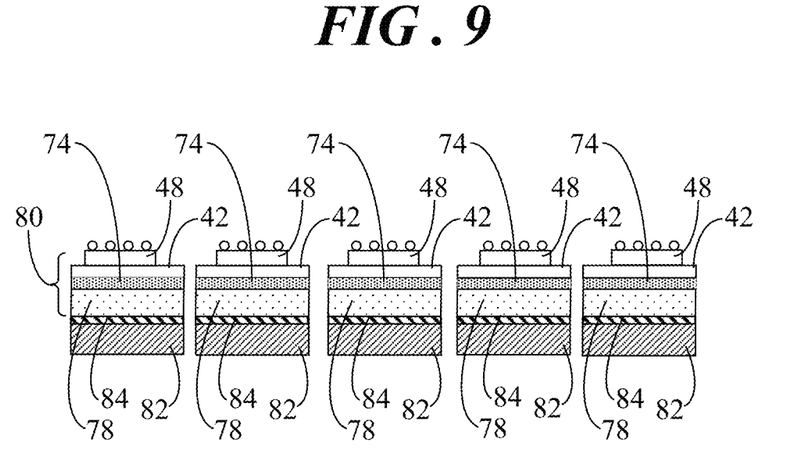
FIG. 9 shows a cross-sectional view of individual semiconductor components formed following dicing of the device wafer of FIG. 8 at a subsequent stage of processing.

FIG. 9 shows a cross-sectional view of individual semiconductor components 80 formed following dicing of device wafer 40 of FIG. 8 at a subsequent stage of processing. Device wafer 40 may be separated at streets 52 (FIG. 8) by dicing, saw cutting, laser cutting, or any other suitable process to form semiconductors components 80 (also referred to as dies or chips) each of which includes active devices 48 on or in substrate 42. Further, each of semiconductor components 80 includes eutectic alloy composition 74 formed at minor surface 46 of substrate 42 and bonding layer 78 deposited on eutectic alloy composition 74. In an example, device wafer 40 may have been removed from carrier structure 64 and stripped of back-grinding tape 58. Thereafter, device wafer 40 is separated at streets 52 to produce individual semiconductor components 80, each of which includes second thickness 76 (FIG. 7) of eutectic alloy composition 74 and bonding layer 84.

The combination of eutectic alloy composition 74 formed at minor surface 46 of substrate 42 and bonding layer 78 over eutectic alloy composition 74 enables a low $R_{DSON}$, due to the electrically conductive pathways between the gold in eutectic alloy composition 74 and bonding layer 78. Additionally, the inclusion of bonding layer 78 provides good barrier properties against the silicon in eutectic alloy composition 74.

In some embodiments, bonding layer 78 may be a solderable backmetal configured to be utilized for joining semiconductor components 80 to secondary structures 82. By way of example, semiconductor components 80 may be attached to secondary structures 82 using a sintering process. In general, a sintering process entails applying a metal-particle containing material 84 to at least one of the solderable backmetal bonding layer 78 and each secondary structure 82. That is, metal-particle containing material 84 is configured to be applied to at least one of solderable backmetal bonding layer 78 and each secondary structure 82. Metal-particle containing material 84 may be applied utilizing a dry state application technique, a wet state application technique, or any manner permitting controlled application of metal particle-containing material 84. Metal particle-containing material 84 contains metal particles that are configured to sinter (become a compacted solid mass without melting) during a sintering process. By way of example, metal particle-containing material 84 may contain at least one of silver particles, gold particles, copper particles, and platinum particles, or a mixture thereof.

Thereafter, semiconductor components 80 are arranged in a stacked relationship with corresponding secondary structures 82 such that metal-particle containing material 84 is disposed between them. A low temperature sintering process may be performed at a maximum process temperature that is less than the melting point of the metal particles within metal-particle containing material 84 to transform metal-particle containing material 84 into a sintered bond layer adhering to bonding layer 78 and thereby joining semiconductor components 80 and secondary structures 82. The sintering process can be carried-out under any process conditions suitable for transforming metal particle-containing material 84 into a sintered bond layer. The sintering process may be performed with or without pressure, with or without heating (although some degree of elevated heat will typically be applied), and in any suitable atmosphere (preferably open air).

Accordingly, eutectic forming material layer 70 (e.g., gold) alloys with silicon substrate 42 to form eutectic alloy composition 74, and eutectic alloy composition 74 is thereafter thinned. The presence of eutectic alloy composition 74 effectively lowers $R_{DSON}$ by reducing the contact resistance between substrate 42 and bonding layer 78. Additionally, bonding layer 78 provides a barrier so that the silicon of eutectic alloy composition 74 cannot diffuse through bonding layer 78. Further, bonding layer 78 is utilized for adhesion (e.g., something for metal-particle containing material 84 to bond with) in order to attach semiconductor components 80 to secondary structures 82. In a non-limiting example, a sintering process may be implemented. However, alternative techniques may implement conventional soldering processes, attachment using adhesive epoxy, and so forth.

Embodiments disclosed herein entail a semiconductor device wafer, semiconductor components, and methodology for manufacturing a device wafer and for attaching semiconductor components of the device wafer to secondary structures. More particularly, methodology entails forming a eutectic alloy composition across the entirety of the back surface of a device wafer and thereafter thinning the eutectic alloy composition. The methodology further entails depositing a bonding layer over the thinned eutectic alloy composition. Eutectic alloy composition formation and deposition of the bonding layer over the thinned eutectic alloy composition may be integrated into a process flow to produce semiconductor components having a low $R_{DSON}$ interface with good barrier properties for interconnection to secondary structures.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method comprising:
   providing a device wafer, the device wafer including a substrate having a major surface and a minor surface opposite the major surface, and a plurality of active devices located at the major surface;
   forming a eutectic alloy composition at the minor surface of the substrate, the eutectic alloy composition having a first thickness;
   partially removing the eutectic alloy composition from the minor surface of the substrate such that a second thickness of the eutectic alloy composition remains on the minor surface, the second thickness being less than the first thickness; and
   depositing a bonding layer over the eutectic alloy composition.

2. The method of claim 1 wherein the substrate is a silicon substrate having the minor surface, and the forming the eutectic alloy composition comprises:
   depositing a eutectic forming material layer on the minor surface of the substrate; and
   alloying the eutectic forming material layer with the silicon substrate to form the eutectic alloy composition.

3. The method of claim 2 wherein the eutectic forming material layer is gold and the eutectic alloy composition comprises a silicon-gold eutectic alloy composition.

4. The method of claim 3 wherein the second thickness of the eutectic alloy composition following the partially removing the eutectic alloy composition is sufficient to yield a homogeneous mixture of gold and silicon.

5. The method of claim 1 wherein the second thickness of the eutectic alloy composition remains overlying an entirety of the minor surface of the substrate following the partially removing the eutectic alloy composition.

6. The method of claim 1 wherein the partially removing the eutectic alloy composition includes utilizing a wet etch process to remove the eutectic alloy composition.

7. The method of claim 1 wherein the partially removing the eutectic alloy composition includes utilizing a deplate process to remove the eutectic alloy composition.

8. The method of claim 1 wherein following the partially removing the eutectic alloy composition and prior to the depositing the bonding layer, the method further comprises thermally processing the device wafer.

9. The method of claim 8 wherein the thermally processing the device wafer includes heating the device wafer to a temperature sufficient to anneal the eutectic alloy composition.

10. The method of claim 9 wherein the temperature is in a range of 300-400° C.

11. The method of claim 1 wherein the depositing the bonding layer comprises depositing a solderable backmetal over the eutectic alloy composition.

12. A method of attaching a semiconductor component to a secondary structure comprising:
providing a device wafer, the device wafer including a substrate having a major surface and a minor surface opposite the major surface, a plurality of semiconductor die areas at the major surface, a plurality of active devices located at the plurality of semiconductor die areas, and streets around peripheries of the semiconductor die areas;
forming a eutectic alloy composition at the minor surface of the substrate, the eutectic alloy composition having a first thickness;
partially removing the eutectic alloy composition from the minor surface of the substrate such that a second thickness of the eutectic alloy composition remains on the minor surface, the second thickness being less than the first thickness;
depositing a bonding layer over the eutectic alloy composition;
separating the plurality of semiconductor die areas at the streets to produce a plurality of semiconductor components each having the bonding layer, the semiconductor component being one of the plurality of semiconductor components; and
utilizing the bonding layer to attach the semiconductor component to the secondary structure.

13. The method of claim 12 wherein the substrate is a silicon substrate having the minor surface, and the forming the eutectic alloy composition comprises:
depositing a eutectic forming material layer on the minor surface of the substrate; and
alloying the eutectic forming material layer with the silicon substrate to form the eutectic alloy composition.

14. The method of claim 12 wherein the utilizing the bonding layer comprises:
applying a metal particle-containing material to at least one of a mounting surface of the secondary structure and the bonding layer; and
sintering the metal particle-containing material to produce a sintered bond layer bonded with the bonding layer to join the semiconductor component to the secondary structure.

15. The method of claim 12 wherein the second thickness of the eutectic alloy composition remains overlying an entirety of the minor surface of the substrate following the partially removing the eutectic alloy composition.

16. The method of claim 12 wherein following the partially removing the eutectic alloy composition and prior to the depositing the bonding layer, the method further comprises thermally processing the device wafer.

17. The method of claim 1, wherein the bonding layer is deposited over the second thickness of the eutectic alloy composition after the eutectic alloy composition has been partially removed from the minor surface of the substrate.

18. The method of claim 17, wherein the bonding layer is epoxy.

19. The method of claim 17, wherein the bonding layer is a solder material.

20. The method of claim 17, wherein the bonding layer is a silver-based solder material.

21. The method of claim 17, wherein the bonding layer comprises metal particles suitable for use as a metal sinter.

22. The method of claim 17, wherein the bonding layer impedes diffusion of silicon away from the minor surface of the substrate.

23. The method of claim 17, wherein the eutectic forming material layer comprises gold and at least one other metal.

24. The method of claim 1, wherein the second thickness of the eutectic alloy composition that remains on the minor surface covers the minor surface.

25. The method of claim 12, wherein the second thickness of the eutectic alloy composition that remains on the minor surface covers the minor surface.

* * * * *